(12) United States Patent
Yoshida

(10) Patent No.: US 11,282,718 B2
(45) Date of Patent: Mar. 22, 2022

(54) SUBSTRATE PROCESSING APPARATUS AND SUBSTRATE PROCESSING METHOD

(71) Applicant: SCREEN Holdings Co., Ltd., Kyoto (JP)

(72) Inventor: Takeshi Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 81 days.

(21) Appl. No.: 16/913,133

(22) Filed: Jun. 26, 2020

(65) Prior Publication Data

US 2020/0328097 A1    Oct. 15, 2020

Related U.S. Application Data

(62) Division of application No. 15/120,862, filed as application No. PCT/JP2015/055036 on Feb. 23, 2015, now Pat. No. 10,777,432.

(30) Foreign Application Priority Data

Feb. 27, 2014 (JP) .............................. JP2014-036344
Feb. 27, 2014 (JP) .............................. JP2014-036345

(51) Int. Cl.
*H01L 21/67* (2006.01)
*H01L 21/687* (2006.01)
(Continued)

(52) U.S. Cl.
CPC ........ *H01L 21/67017* (2013.01); *B05D 1/002* (2013.01); *B05D 3/0466* (2013.01);
(Continued)

(58) Field of Classification Search
None
See application file for complete search history.

(56) References Cited

U.S. PATENT DOCUMENTS 5,314,574 A    5/1994  Takahashi ..................... 156/646
5,591,262 A    1/1997  Sago et al. .................... 118/306
(Continued)

FOREIGN PATENT DOCUMENTS

CN    1511337 A    7/2004
CN    1914714 A    2/2007
(Continued)

OTHER PUBLICATIONS

International Search Report dated May 19, 2015 in corresponding PCT International Application No. PCT/JP2015/055036.
(Continued)

*Primary Examiner* — Allan W. Olsen
(74) *Attorney, Agent, or Firm* — Ostrolenk Faber LLP

(57) ABSTRACT

A substrate processing apparatus includes a chamber body having an upper opening, a chamber lid part having a lower opening, and a shield plate arranged in a lid internal space of the chamber lid part. The radial dimension of the shield plate is greater than that of the lower opening. Covering the upper opening of the chamber body with the chamber lid part forms a chamber that internally houses a substrate. In the substrate processing apparatus, before the substrate is conveyed and the chamber is formed, the lid internal space of the chamber lid part is filled with the gas supplied from a gas supply part, in a state in which the shield plate overlaps with the lower opening. This allows the chamber to be quickly filled with the gas to achieve a desired low oxygen atmosphere after the formation of the chamber.

10 Claims, 8 Drawing Sheets

(51) Int. Cl.
*H01L 21/311* (2006.01)
*B05D 3/04* (2006.01)
*B05D 1/00* (2006.01)
*H01L 21/02* (2006.01)

(52) U.S. Cl.
CPC .. *H01L 21/02307* (2013.01); *H01L 21/02343* (2013.01); *H01L 21/31105* (2013.01); *H01L 21/6708* (2013.01); *H01L 21/6719* (2013.01); *H01L 21/67023* (2013.01); *H01L 21/68742* (2013.01); *H01L 21/02063* (2013.01)

(56) References Cited

U.S. PATENT DOCUMENTS

| | | | |
|---|---|---|---|
| 6,419,751 | B1 | 7/2002 | Nagashima ............... 118/715 |
| 9,555,437 | B2 * | 1/2017 | Nakai ............... B05C 11/1039 |
| 10,249,517 | B2 * | 4/2019 | Iwao ............... H01L 21/67051 |
| 10,366,908 | B2 | 7/2019 | Yoshida |
| 2003/0024645 | A1 | 2/2003 | Orii et al. ............... 156/345.33 |
| 2004/0241991 | A1 | 12/2004 | Aoyama et al. ............... 438/689 |
| 2007/0175062 | A1 | 8/2007 | Toshima et al. ............... 34/410 |
| 2007/0178698 | A1 | 8/2007 | Okita et al. ............... 438/689 |
| 2009/0079122 | A1 | 3/2009 | Obweger ............... 269/57 |
| 2011/0240601 | A1 * | 10/2011 | Hashizume ............ B44C 1/227 216/83 |
| 2012/0234356 | A1 | 9/2012 | Nishi et al. ............... 134/21 |
| 2013/0106489 | A1 | 5/2013 | Zhang et al. ............... 327/365 |
| 2013/0228550 | A1 | 9/2013 | Mori et al. ............... 216/61 |
| 2014/0060423 | A1 | 3/2014 | Nakai et al. ............... 118/50 |
| 2014/0227883 | A1 | 8/2014 | Izumoto et al. ............... 438/745 |
| 2014/0273498 | A1 | 9/2014 | Kobayashi et al. ............... 438/745 |
| 2014/0290703 | A1 | 10/2014 | Kobayashi et al. ............... 134/33 |
| 2015/0279721 | A1 | 10/2015 | Kikumoto et al. ............ 279/128 |
| 2016/0042980 | A1 | 2/2016 | Ohashi ............... 156/345.18 |
| 2017/0117135 | A1 | 4/2017 | Yoshida et al. |
| 2017/0148648 | A1 | 5/2017 | Yoshida |
| 2017/0287741 | A1 | 10/2017 | Yoshida |
| 2017/0338131 | A1 | 11/2017 | Amahisa et al. |

FOREIGN PATENT DOCUMENTS

| | | |
|---|---|---|
| JP | 6-13361 | 1/1994 |
| JP | 2001-102370 A | 4/2001 |
| JP | 2003-284993 A | 10/2003 |
| JP | 2005-268244 | 9/2005 |
| JP | 2009-141383 | 6/2009 |
| JP | 2010-056218 | 3/2010 |
| JP | 2011-216608 | 10/2011 |
| TW | 201033401 A1 | 9/2010 |
| TW | 201338034 A | 9/2013 |
| TW | I 496417 B | 8/2015 |

OTHER PUBLICATIONS

Written Opinion dated May 19, 2015 in corresponding PCT International Application No. PCT/JP2015/055036.
Notification Concerning Transmitaal of Copy of International Preliminary Report on Patentability including PCT/IB/373 and PCT/ISA/237 (in Japanese) dated Sep. 9, 2016.
Notification of Transmittal of Translation of the International Preliminary Report onPatentability including PCT/IB/373 and PCT/ISA/237 (in English) dated Sep. 9, 2016.
Office Action dated Jul. 7, 2021 for corresponding Chinese Application No. 201811396341.X (machine translation attached).

* cited by examiner

SUBSTRATE PROCESSING APPARATUS AND SUBSTRATE PROCESSING METHOD

CROSS-REFERENCE TO RELATED APPLICATIONS

The present application is a divisional of U.S. patent application Ser. No. 15/120,862, filed Aug. 23, 2016, which a 35 U.S.C. §§ 371 national phase conversion of PCT/JP2015/055036, filed Feb. 23, 2015, which claims priority to Japanese Patent Application Nos. 2014-036344 and 2014-036345, both filed Feb. 27, 2014, the contents of all of which are incorporated herein by reference. The PCT International Application was published in the Japanese language.

TECHNICAL FIELD

The present invention relates to a substrate processing apparatus and method for processing substrates.

BACKGROUND ART

A process of manufacturing semiconductor substrates (hereinafter, simply referred to as "substrates") conventionally involves various types of processing that is performed on substrates by various types of substrate processing apparatuses. For example, processing such as etching is performed on a surface of a substrate having a resist pattern on the surface thereof, by supplying a chemical solution to the substrate. After the etching process ends, other processing is also performed, such as supplying a removing liquid to the substrate to remove a resist from the substrate or supplying a cleaning liquid to the substrate to clean the substrate.

In the case where the processing of substrates is performed in an environment in which oxygen exists (e.g., in the air), oxygen may adversely affect the substrates. For example, oxygen may be dissolved in a chemical solution that is used in processing, and this chemical solution may adversely affect a surface of a substrate due to coming in contact with the surface of the substrate. In particular, in the processing of a substrate having a metal film on the surface, the metal film may oxidize during processing. It is sought to avoid such oxidation of the metal film as much as possible.

A substrate processing apparatus disclosed in Japanese Patent Application Laid-Open No. 2010-56218 (Document 1) includes a shield part that opposes a substrate held by a substrate holding mechanism. The shield part includes a substrate opposing surface that opposes the upper surface of the substrate, and a peripheral wall part that protrudes toward the substrate holding mechanism from the periphery of the substrate opposing surface. The substrate receives supply of a chemical solution that is a mixture of inert gas-dissolved water with low oxygen concentration and an undiluted chemical solution. The shield part provided in the substrate processing apparatus of Document 1 allows the atmosphere above the upper surface of the substrate to be cut off from the outside atmosphere and suppresses an increase in the oxygen concentration in the atmosphere above the substrate. Reducing the oxygen concentration above the substrate, for example, suppresses oxidation of the metal film provided on the upper surface of the substrate.

Incidentally, in the substrate processing apparatus of Document 1, the inside and outside of the shield part are not completely isolated from each other, and thus there is a limit to reducing the oxygen concentration in the atmosphere above the substrate. There is also a limit to quickly reducing the oxygen concentration within the shield part. On the other hand, it is conceivable to provide a substrate holder and a processing-liquid supply part within a chamber (treatment chamber) and to create a low oxygen condition in the chamber by sealing the chamber after the substrate is conveyed in the chamber and supplying an inert gas or the like to the internal space of the chamber. However, it takes a certain amount of time to create a sufficiently low oxygen condition in the internal space of the chamber.

SUMMARY OF INVENTION

The present invention is intended for a substrate processing apparatus for processing a substrate and a substrate processing method, and it is an object of the present invention to quickly create a desired gas atmosphere in a chamber.

The substrate processing apparatus according to the present invention includes a substrate holder for holding a substrate in a horizontal position, a chamber lid part having a lower opening and forming a lid internal space above the lower opening, a chamber body having an upper opening and forming a chamber-body internal space, the upper opening opposing the lower opening in an up-down direction, a chamber opening-and-closing mechanism for moving the chamber lid part relative to the chamber body in the up-down direction, and by covering the upper opening with the chamber lid part, forming a chamber that internally houses the substrate holder, a processing-liquid supply part for supplying a processing liquid to an upper surface of the substrate, a shield plate that is arranged in the lid internal space to oppose the upper surface of the substrate and is capable of blocking the lower opening, a shield-plate movement mechanism for moving the shield plate relative to the chamber lid part in the up-down direction within the lid internal space, and a gas supply part for supplying gas to the lid internal space in a state in which the shield plate overlaps with the lower opening of the chamber lid part. With this substrate processing apparatus, it is possible to quickly create a desired gas atmosphere in the chamber.

In a preferred embodiment of the present invention, the substrate processing apparatus further includes a substrate movement mechanism for moving the substrate along with the substrate holder relative to the chamber in the up-down direction. In a state in which the shield plate is spaced from the lower opening of the chamber lid part, the substrate movement mechanism moves the substrate between the lid internal space and the chamber-body internal space through the lower opening and the upper opening within the chamber.

In another preferred embodiment of the present invention, the chamber lid part includes a lid body part having an upside-down cup shape, and a ring-shaped lid bottom part that extends radially inward from a lower edge of the lid body part and has the lower opening in a central part. The lower opening is blocked when a lower surface of the shield plate that overlaps with the lower opening is in contact with an upper surface of the lid bottom part along an entire periphery of the lower opening.

More preferably, the upper surface of the lid bottom part is inclined downward outwardly in the radial direction, and a discharge port for discharging a liquid in the lid internal space is provided at a connection between the lid bottom part and the lid body part of the chamber lid part.

In another preferred embodiment of the present invention, the shield plate has a gas port in a central part of a lower surface, and the gas supply part supplies the gas through the gas port to a space between the lower surface of the shield plate and the upper surface of the substrate.

In another preferred embodiment of the present invention, the substrate processing apparatus further includes a substrate rotation mechanism for rotating the substrate along with the substrate holder about a central axis pointing in the up-down direction. The chamber body includes a cup part that is located below the chamber lid part on an outer side, in a radial direction, of an entire periphery of the substrate holder and for receiving a processing liquid dispersed from the substrate that rotates.

More preferably, the chamber body further includes an outer cylinder part located on an outer side, in the radial direction, of an entire periphery of the cup part, and when in contact with the chamber lid part, forming the chamber, and an outer cylinder connector for blocking a gap between an upper edge of the outer cylinder part and the cup part.

In another preferred embodiment of the present invention, the substrate processing apparatus further includes a substrate rotation mechanism for rotating the substrate along with the substrate holder about a central axis pointing in the up-down direction. When the substrate is rotated within the lid internal space by the substrate rotation mechanism, the shield plate rotates about the central axis at a position that is in close proximity to the substrate.

The substrate processing method according to the present invention is a substrate processing method for processing a substrate in a substrate processing apparatus that comprises a substrate holder for holding a substrate in a horizontal position, a chamber lid part having a lower opening and forming a lid internal space above the lower opening, a chamber body having an upper opening and forming a chamber-body internal space, the upper opening opposing the lower opening in an up-down direction, and a shield plate that is arranged in the lid internal space to oppose an upper surface of the substrate and is capable of blocking the lower opening. The method includes a) supplying gas to the lid internal space in a state in which the shield plate overlaps with the lower opening of the chamber lid part, b) holding the substrate by the substrate holder in a state in which the chamber lid part is spaced from the chamber body, c) moving the chamber lid part relative to the chamber body in the up-down direction, and by covering the upper opening with the chamber lid part, forming a chamber that internally houses the substrate and the substrate holder, d) moving the shield plate upward relative to the chamber lid part to separate the shield plate from the lower opening, e) supplying the gas into the chamber, and f) supplying a processing liquid to the upper surface of the substrate. With this substrate processing method, it is possible to quickly create a desired gas atmosphere in the chamber.

These and other objects, features, aspects and advantages of the present invention will become more apparent from the following detailed description of the present invention when taken in conjunction with the accompanying drawings.

DESCRIPTION OF EMBODIMENTS

Figure 1:
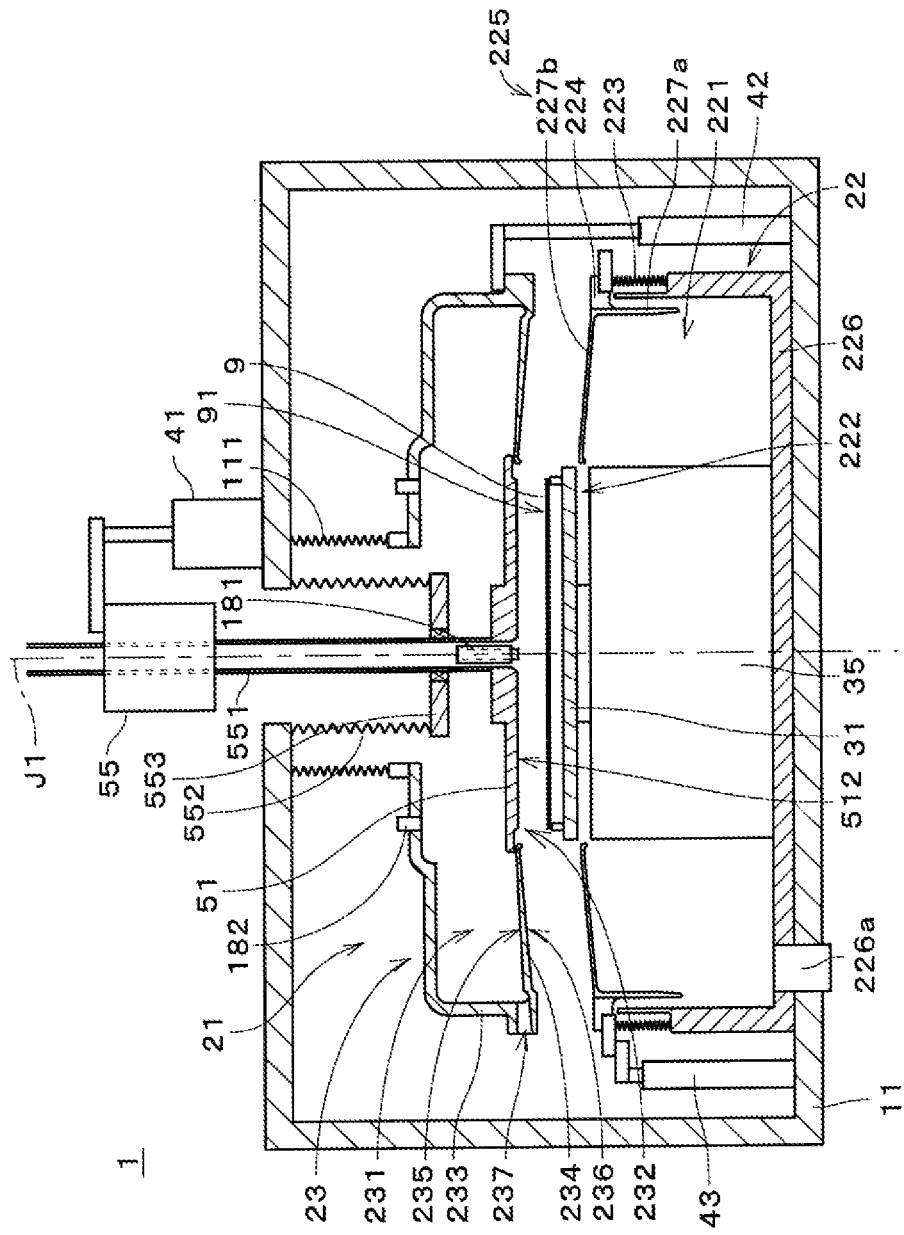
FIG. 1 is a cross-sectional view of a substrate processing apparatus according to an embodiment.

FIG. 1 is a cross-sectional view of a substrate processing apparatus 1 according to an embodiment of the present invention. The substrate processing apparatus 1 is a single wafer processing apparatus for processing generally disc-shaped semiconductor substrates 9 (hereinafter, simply referred to as "substrates 9") one at a time by supplying processing liquids to the substrates 9. The cross sections of some constituent elements of the substrate processing apparatus 1 are not cross-hatched in FIG. 1 (the same applies to the other cross-sectional views).

The substrate processing apparatus 1 includes a chamber 21, a substrate holder 31, a substrate rotation mechanism 35, a first movement mechanism 41, a second movement mechanism 42, a third movement mechanism 43, a shield plate 51, a shield-plate rotation mechanism 55, and a housing 11. The housing 11 houses, for example, the chamber 21, the substrate holder 31, and the shield plate 51.

The chamber 21 has a covered and bottomed generally cylindrical shape about a central axis J1 pointing in the up-down direction. The chamber 21 includes a chamber body 22 and a chamber lid part 23. The chamber body 22 and the chamber lid part 23 oppose each other in the up-down direction. In the state illustrated in FIG. 1, the chamber body 22 and the chamber lid part 23 are spaced from each other in the up-down direction. The chamber body 22 has a bottomed generally cylindrical shape about the central axis J1, and forms a chamber-body internal space 221. The chamber lid part 23 has a covered generally cylindrical shape about the central axis J1, and forms a lid internal space 231. The chamber body 22 and the chamber lid part 23 have approximately the same outer diameter.

The chamber body 22 has a generally circular upper opening 222. The chamber lid part 23 has a generally circular lower opening 232. The upper opening 222 of the chamber body 22 opposes the lower opening 232 of the chamber lid part 23 in the up-down direction. The upper opening 222 of the chamber body 22 and the lower opening 232 of the chamber lid part 23 have approximately the same diameter. The dimension of the lid internal space 231 of the chamber lid part 23 in the radial direction about the central axis J1 is greater than the radial dimension (i.e., diameter) of the lower opening 232. The details of the structures of the chamber body 22 and the chamber lid part 23 will be described later.

The substrate holder 31 has a generally disk-like shape about the central axis J1. The substrate holder 31 is arranged below the substrate 9 and holds the outer edge portion of the substrate 9 in a horizontal position. In the state illustrated in FIG. 1, the substrate holder 31 is located between the chamber body 22 and the chamber lid part 23 in the up-down direction. The diameter of the substrate holder 31 is greater than the diameter of the substrate 9. The diameter of the substrate holder 31 is also smaller than the diameter of the upper opening 222 of the chamber body 22 and the diameter of the lower opening 232 of the chamber lid part 23. The upper opening 222 of the chamber body 22 and the lower opening 232 of the chamber lid part 23 oppose the substrate 9 and the substrate holder 31 in the up-down direction. The substrate rotation mechanism 35 is arranged below the substrate holder 31. The substrate rotation mechanism 35 rotates the substrate 9 along with the substrate holder 31 about the central axis J1.

The shield plate 51 has a generally disk-like shape about the central axis J1. The shield plate 51 is arranged in the lid internal space 231, which is the internal space of the chamber lid part 23. The radial dimension (i.e., diameter) of the shield plate 51 is preferably greater than the diameter of the lower opening 232 of the chamber lid part 23. The shield plate 51 is capable of blocking the lower opening 232 of the chamber lid part 23. The shield plate 51 opposes an upper surface 91 of the substrate 9 held by the substrate holder 31, via the lower opening 232 in the up-down direction.

The shield-plate rotation mechanism 55 is arranged above the shield plate 51. The shield-plate rotation mechanism 55 is, for example, a hollow shaft motor. The shield-plate rotation mechanism 55 rotates the shield plate 51 about the central axis J1 within the lid internal space 231 of the chamber lid part 23. The rotation of the shield plate 51 by the shield-plate rotation mechanism 55 is independent of the rotation of the substrate 9 by the substrate rotation mechanism 35.

A rotation shaft 551 of the shield-plate rotation mechanism 55 is connected to the shield plate 51 through a through hole provided at the top of the housing 11 and a through hole provided at the top of the chamber lid part 23. A portion of the housing 11 around the above through hole and a portion of the chamber lid part 23 around the above through hole are connected to each other by a generally cylindrical extendable member 111 (e.g., bellows) that is extendable in the up-down direction. The rotation shaft 551 has a generally disk-like flange part 553. The outer peripheral portion of this flange part 553 and the portion of the housing 11 around the above through hole are connected to each other by a generally cylindrical extendable member 552 (e.g., bellows) that is extendable in the up-down direction. In the substrate processing apparatus 1, the space within the housing 11 and the space outside the housing 11 are isolated from each other by the flange part 553 and the extendable member 552. Also, the space within the chamber lid part 23 and the space that is within the housing 11 and outside the chamber lid part 23 are isolated from each other by the extendable member 111.

Figure 2:
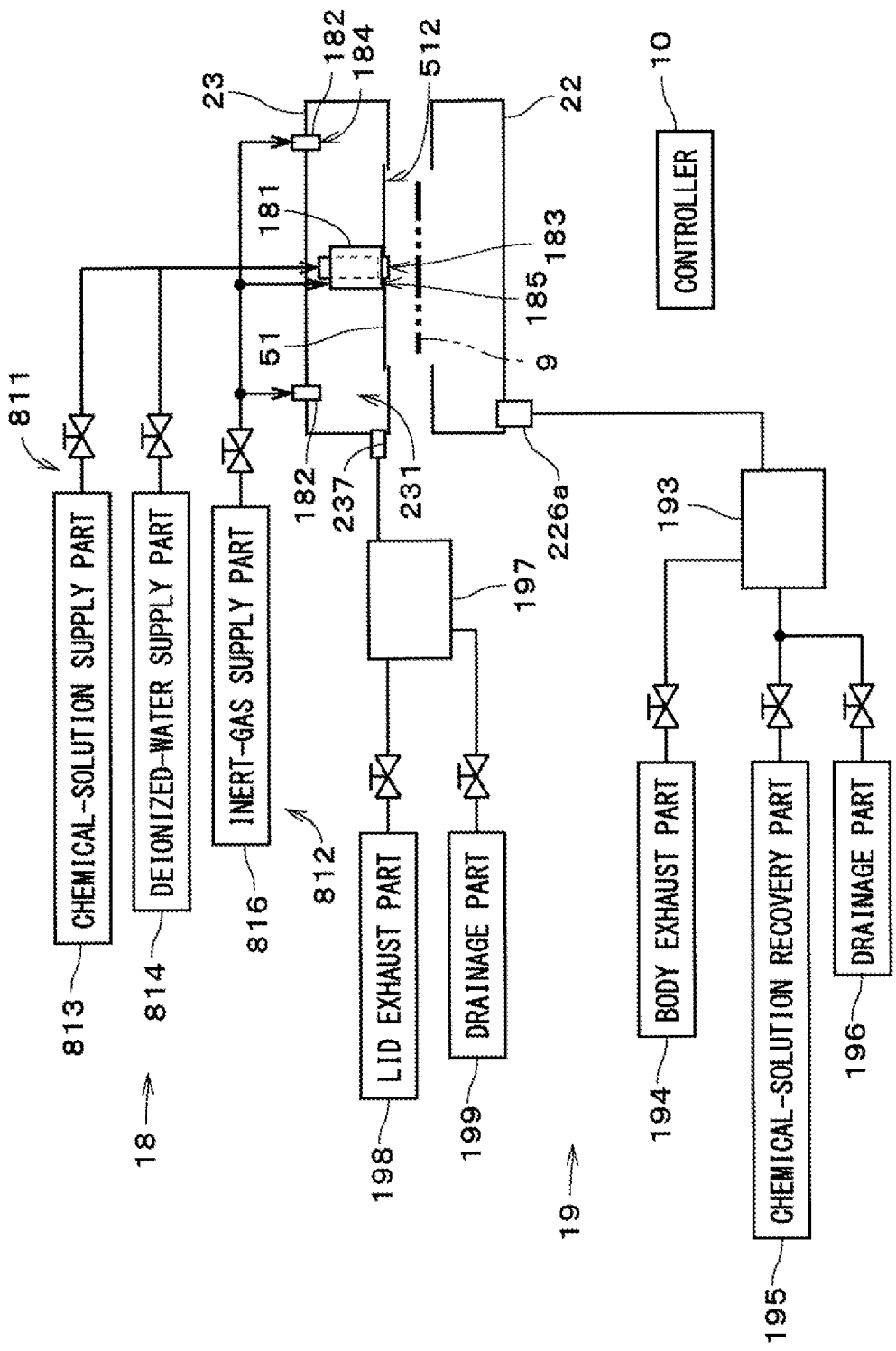
FIG. 2 is a block diagram of a gas-liquid supply part and a gas-liquid discharge part.

FIG. 2 is a block diagram of a gas-liquid supply part 18 and a gas-liquid discharge part 19 of the substrate processing apparatus 1. The gas-liquid supply part 18 includes a processing-liquid supply part 811 and a gas supply part 812. The processing-liquid supply part 811 includes an upper central nozzle 181, a chemical-solution supply part 813, and a deionized-water supply part 814. The chemical-solution supply part 813 and the deionized-water supply part 814 are connected via different valves to the upper central nozzle 181. The gas supply part 812 includes the upper central nozzle 181, a plurality of lid nozzles 182, and an inert-gas supply part 816. The inert-gas supply part 816 is connected to the upper central nozzle 181 via a valve. The inert-gas supply part 816 is also connected to the lid nozzles 182 via valves.

As illustrated in FIGS. 1 and 2, the lid nozzles 182 are provided at the top of the chamber lid part 23. The lid nozzles 182 are arranged circumferentially about the central axis J1. As illustrated in FIG. 2, each lid nozzle 182 has a first gas port 184 at the lower end. The inert gas sent from the inert-gas supply part 816 is supplied from the plurality of first gas ports 184 provided at the top of the chamber lid part 23 to the lid internal space 231.

The upper central nozzle 181 is provided in the rotation shaft 551 of the shield-plate rotation mechanism 55 as illustrated in FIG. 1. As illustrated in FIG. 2, the upper central nozzle 181 has a processing-liquid ejection port 183 in the central part of the lower end, the processing-liquid ejection port 183 being a port for supplying processing liquids (i.e., chemical solution from the chemical-solution supply part 813 and deionized water from the deionized-water supply part 814) toward the upper surface 91 of the substrate 9. The upper central nozzle 181 also has a generally ring-shaped second gas port 185 in the lower end, the second gas port 185 being arranged around the processing-liquid ejection port 183. The inert gas sent from the inert-gas supply part 816 is supplied from the second gas port 185 toward the space below the shield plate 51 (i.e., space between a lower surface 512 of the shield plate 51 and the upper surface 91 of the substrate 9). The lower end of the upper central nozzle 181 is arranged at approximately the same position in the up-down direction as the lower surface 512 of the shield plate 51. That is, the processing-liquid ejection port 183 and second gas port 185 of the upper central nozzle 181 are provided in the central part of the lower surface 512 of the shield plate 51.

The gas-liquid discharge part 19 includes a body discharge port 226a, a lid discharge port 237, a gas-liquid separator 193, a body exhaust part 194, a chemical-solution recovery part 195, a drainage part 196, a gas-liquid separator 197, a lid exhaust part 198, and a drainage part 199. The body discharge port 226a is provided in the chamber body 22 and connected to the gas-liquid separator 193. The gas-liquid separator 193 is connected via different valves to the body exhaust part 194, the chemical-solution recovery part 195, and the drainage part 196. The lid discharge port 237 is provided in the chamber lid part 23 and connected to the gas-liquid separator 197. The gas-liquid separator 197 is connected via different valves to the lid exhaust part 198 and the drainage part 199. The constituent elements of the gas-liquid supply part 18 and the gas-liquid discharge part 19 are controlled by the controller 10. The first movement mechanism 41, the second movement mechanism 42, the third movement mechanism 43, the substrate rotation mechanism 35, and the shield-plate rotation mechanism 55 (see FIG. 1) are also controlled by the controller 10.

The chemical solution supplied from the chemical-solution supply part 813 to the substrate 9 via the upper central nozzle 181 may be a polymer removing liquid, or an etchant such as hydrofluoric acid or an aqueous solution of tetramethylammonium hydroxide (TMAH). The deionized-water supply part 814 supplies deionized water (DIW) to the substrate 9 via the upper central nozzle 181. The processing-liquid supply part 811 may include other supply parts for supplying processing liquids other than the above chemical solution and deionized water. The gas supplied from the inert-gas supply part 816 may be a nitrogen ($N_2$) gas. The gas supply part 812 may include other supply parts for supplying inert gases other than a nitrogen gas, or gases other than inert gases.

As illustrated in FIG. 1, the chamber body 22 includes an outer cylinder part 223, an outer cylinder connector 224, a cup part 225, and a body bottom part 226. The cup part 225 has a generally cylindrical shape about the central axis J1. The cup part 225 is located below the chamber lid part 23 on the radially outer side of the entire circumference of the substrate rotation mechanism 35. The cup part 225 includes a generally cylindrical cup side wall part 227 that is centered on the central axis J1, and a generally circular-ring shaped cup canopy part 227b that extends radially inward from the upper edge of the cup side wall part 227a. An opening in the center of the canopy part 227b is the aforementioned upper opening 222.

The outer cylinder part 223 has a generally cylindrical shape about the central axis J1. The outer cylinder part 223 is located on the radially outer side of the entire circumference of the cup part 225. For example, the outer cylinder part 223 may be a bellows in which a plurality of circumferentially extending mountain-fold lines and a plurality of circumferentially extending valley-fold lines are alternately arranged in the up-down direction. The bottomed generally cylindrical body bottom part 226 is arranged below the outer cylinder part 223, the cup part 225, and the substrate holder 31. The lower edge of the outer cylinder part 223 is connected to the upper edge of a side wall part of the body bottom part 226 along the entire circumference. The body bottom part 226 has the aforementioned body discharge port 226a in the bottom. The body discharge port 226a is arranged below the substrate 9, the substrate holder 31, and the cup part 225 within the chamber-body internal space 221, which is the internal space of the chamber body 22. Through this body discharge port 226a, the liquid and gas in the chamber body 22 are discharged to the outside of the chamber body 22 (i.e., outside of the chamber 21). Alternatively, the body bottom part 226 may have a plurality of circumferentially arranged body discharge ports 226a.

The outer cylinder connector 224 has a generally circular-ring shape about the central axis J1. The outer cylinder connector 224 connects the upper edge of the outer cylinder part 223 and the outer edge of the cup part 225. More specifically, the outer cylinder connector 224 connects the upper edge of the outer cylinder part 223 and the outer edge of the cup canopy part 227b. The outer cylinder connector 224 blocks a gap between the upper edge of the outer cylinder part 223 and the cup part 225.

The chamber lid part 23 includes a lid body part 233 and a lid bottom part 234. The lid body part 233 has a covered generally cylindrical shape about the central axis J1. In other words, the lid body part 233 has an upside-down cup shape. As described previously, the through hole in the central part of the lid body part 233, i.e., the through hole at the top of the chamber lid part 23, is blocked by the extendable members 111 and 552, part of the top of the housing 11, and the flange part 553. These members that block the through hole may be regarded as part of the lid body part 233. A tubular space formed by the extendable members 111 and 552 is part of the lid internal space 231.

The lid bottom part 234 has a generally circular-ring shape about the central axis J1 and has the aforementioned lower opening 232 in the central part. The lid bottom part 234 extends radially inward from the lower edge of the lid body part 233. Upper and lower surfaces 235 and 236 of the lid bottom part 234 are inclined surfaces that are inclined downward outwardly in the radial direction. The aforementioned lid discharge port 237 is provided at the connection between the lid bottom part 234 and lid body part 233 of the chamber lid part 23. The liquid and gas in the lid internal space 231 are discharged through this lid discharge port 237.

In the state illustrated in FIG. 1, the shield plate 51 overlaps with the lower opening 232 of the chamber lid part 23. At this time, the lower surface 512 of the shield plate 51 is in contact with the upper surface 235 of the lid bottom part 234 along the entire circumference of the lower opening 232. More specifically, the outer circumferential part of the lower surface 512 of the shield plate 51 is in contact with a portion of the upper surface 235 of the lid bottom part 234 that is in the vicinity of the lower opening 232 along the entire circumference of the lower opening 232. Thus, the lower opening 232 of the chamber lid part 23 is blocked by the shield plate 51, and this makes the lid internal space 231 above the lower opening 232 an enclosed space. While the connection between the shield plate 51 and the lid bottom part 234 in the present embodiment does not provide a completely sealed structure and therefore the lid internal space 231 is not completely cut off from the outside space, this connection may be configured to provide a sealed structure including, for example, a sealing member to make the lid internal space 231 an enclosed space that is isolated from the outside space.

The first movement mechanism 41 is, for example, arranged on the upper side of the housing 11. The first movement mechanism 41 moves the shield plate 51 along with the shield-plate rotation mechanism 55 in the up-down direction. The shield plate 51 is moved in the up-down direction within the lid internal space 231 of the chamber lid part 23 by the first movement mechanism 41. Since, as described above, the shield plate 51 is larger than the lower opening 232 of the chamber lid part 23, the shield plate 51 does not move to the outside of the chamber lid part 23 (i.e., below the lid bottom part 234) through the lower opening 232. The first movement mechanism 41 includes, for example, a motor and a ball screw (the same applies to the second movement mechanism 42 and the third movement mechanism 43).

The second movement mechanism 42 is arranged laterally to the chamber body 22 and moves the chamber lid part 23 in the up-down direction. More specifically, the chamber lid part 23 is moved between an "upper position" illustrated in FIG. 1 and a "lower position" illustrated in FIG. 3 by the second movement mechanism 42. In the state in which the chamber lid part 23 is located at the upper position, the lower opening 232 is located above the substrate 9 on the substrate holder 31, and in the state in which the chamber lid part 23 is located at the lower position, the lower opening 232 is located below the substrate 9 on the substrate holder 31. When the chamber lid part 23 is moved from the upper position to the lower position that is below the upper position, the shield plate 51 is also moved in the up-down direction by the first movement mechanism 41, and the position of the shield plate 51 in the up-down direction relative to the chamber lid part 23 is changed. That is, the first movement mechanism 41 and the second movement mechanism 42 serve as a shield-plate movement mechanism for moving the shield plate 51 relative to the chamber lid part 23 in the up-down direction within the lid internal space 231 of the chamber lid part 23.

The third movement mechanism 43 is arranged laterally to the chamber body 22 and moves part of the chamber body 22 in the up-down direction. More specifically, the cup part 225 of the chamber body 22 is moved between a "lower position" illustrated in FIGS. 1 and 3 and an "upper position" illustrated in FIG. 4 by the third movement mechanism 43. In the state in which the cup part 225 is located at the lower position, the upper opening 222 is located below the substrate 9 on the substrate holder 31, and in the state in which the cup part 225 is located at the upper position, the upper opening 222 is located above the substrate 9 on the substrate holder 31. When the cup part 225 is moved in the up-down direction, the outer cylinder part 223 extends and contracts in the up-down direction. In the substrate processing apparatus 1, the position of the shield plate 51 in the up-down direction relative to the chamber lid part 23 is also changed when the cup part 225 of the chamber body 22 is moved from the lower position to the upper position that is above the lower position. Note that, in the substrate processing apparatus 1, the body bottom part 226 of the chamber body 22 and the substrate holder 31 do not move in the up-down direction.

Figure 3:
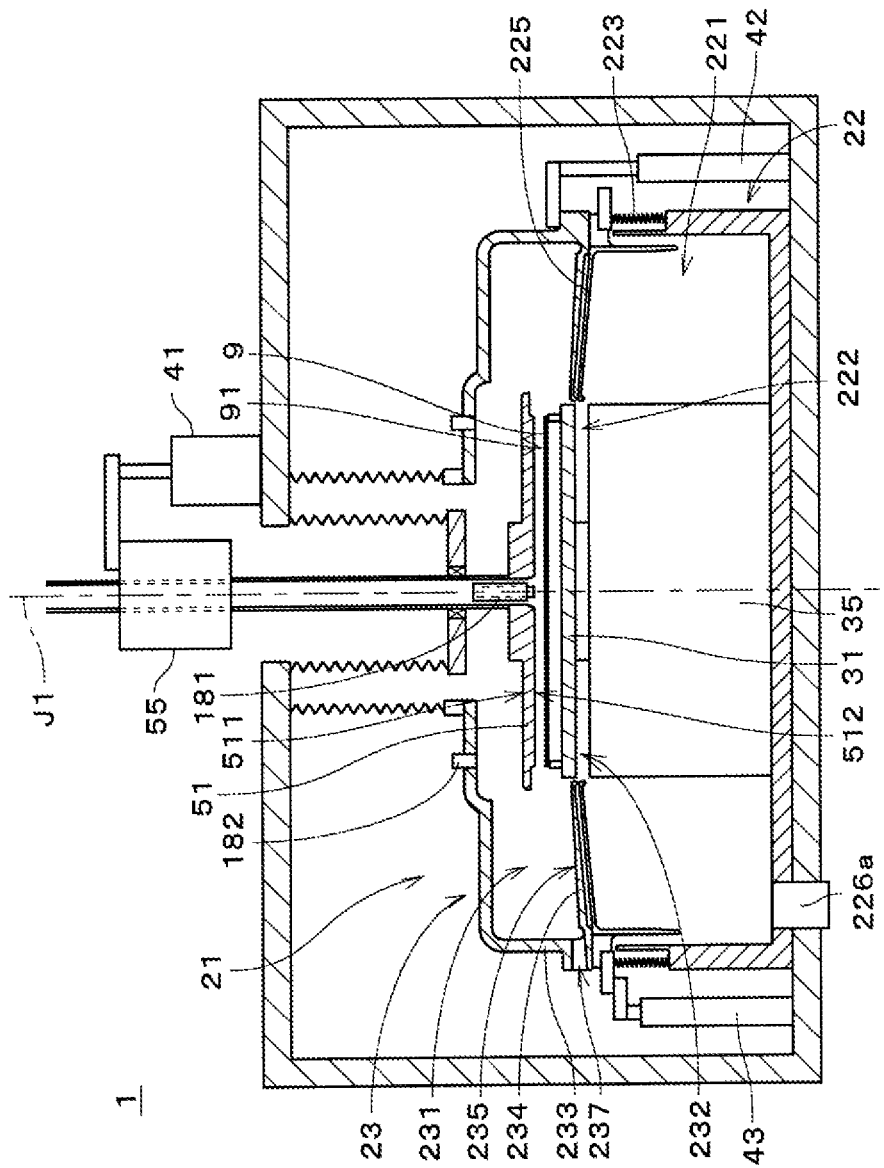
FIG. 3 is a cross-sectional view of the substrate processing apparatus.

In the state in which the chamber lid part 23 is located at the lower position and the cup part 225 of the chamber body 22 is also located at the lower position as illustrated in FIG. 3, the upper opening 222 of the chamber body 22 is covered with the chamber lid part 23, with the upper opening 222 opposing the lower opening 232 of the chamber lid part 23. In this case, the chamber 21 with an internal enclosed space (i.e., space including the lid internal space 231 and the chamber-body internal space 221, and this space is hereinafter referred to as a "chamber space") is formed. More specifically, the chamber 21 is formed when the connection between the lid body part 233 and lid bottom part 234 of the chamber lid part 23 is in contact with the outer cylinder part 223 of the chamber body 22.

Figure 4:
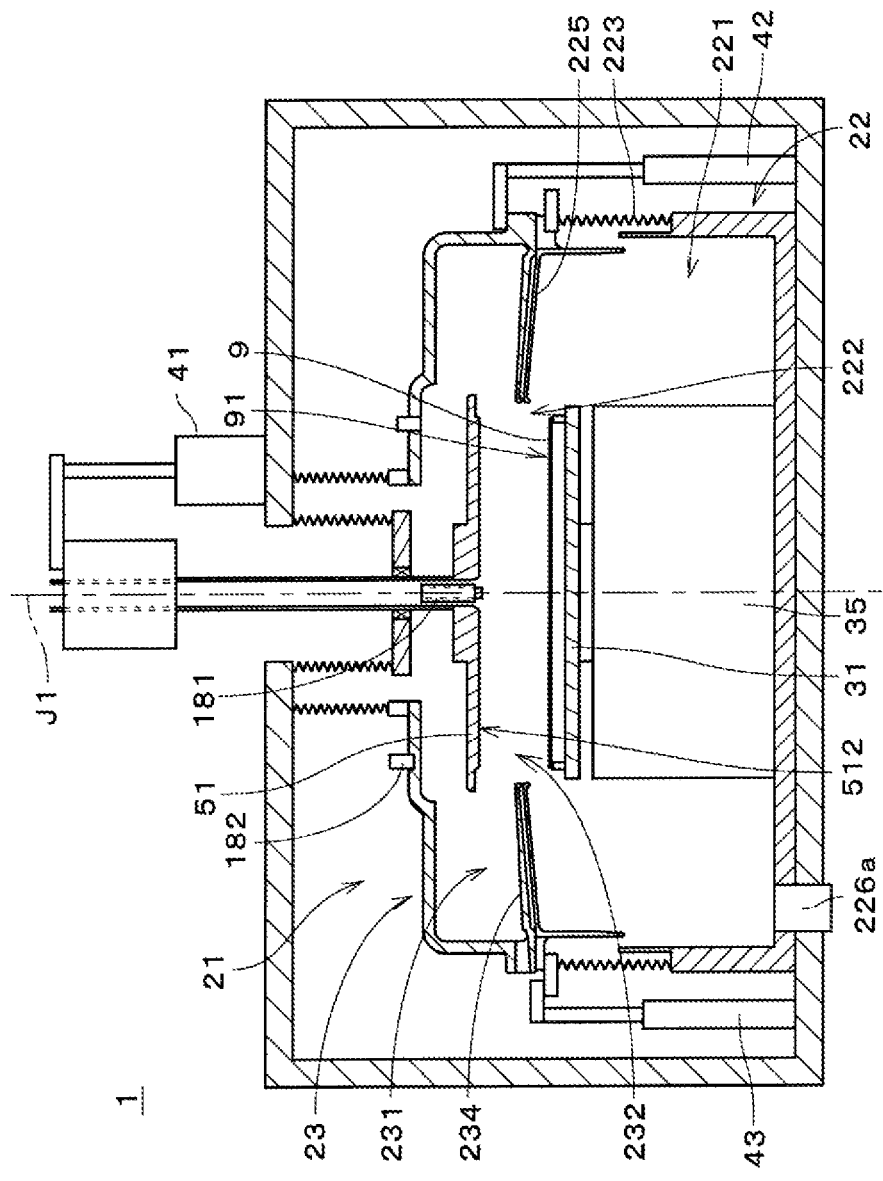
FIG. 4 is a cross-sectional view of the substrate processing apparatus.

Similarly, in the state in which the cup part 225 of the chamber body 22 is located at the upper position and the chamber lid part 23 is also located at the upper position as illustrated in FIG. 4, the upper opening 222 of the chamber body 22 is covered with the chamber lid part 23, and this forms the chamber 21. As illustrated in FIGS. 3 and 4, the substrate 9 and the substrate holder 31 are housed within the chamber 21 (i.e., chamber space). That is, the second movement mechanism 42 and the third movement mechanism 43 serve as a chamber opening-and-closing mechanism that moves the chamber lid part 23 relative to the chamber body 22 in the up-down direction, and by covering the upper opening 222 of the chamber body 22 with the chamber lid part 23, forms the chamber 21.

Figure 5:
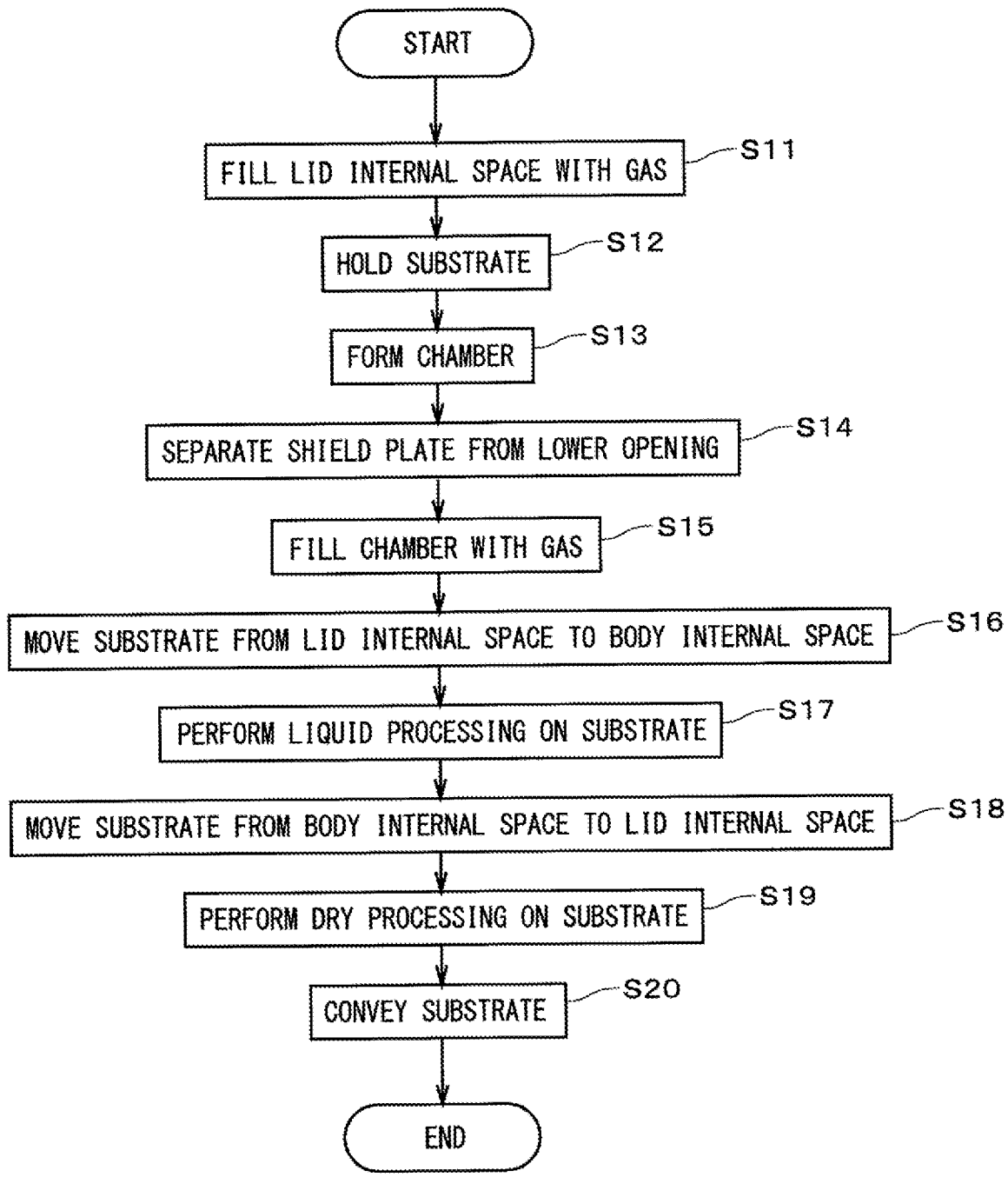
FIG. 5 is a flowchart of processing performed on a substrate.

Next, the procedure of processing performed on the substrate 9 by the substrate processing apparatus 1 will be described with reference to FIG. 5. In the substrate processing apparatus 1, first, the chamber lid part 23 is located at the upper position and the cup part 225 of the chamber body 22 is located at the lower position as illustrated in FIG. 1. In other words, the chamber 21 is open. Also, the shield plate 51 overlaps with the lower opening 232 of the chamber lid part 23 in a plan view so that the lower surface 512 of the shield plate 51 is in contact with the upper surface 235 of the lid bottom part 234. This blocks the lower opening 232 and makes the lid internal space 231 an enclosed space. In this state, the gas supply part 812 (see FIG. 2) supplies a nitrogen gas to the lid internal space 231 through the plurality of first gas ports 184. Also, the gas in the lid internal space 231 is discharged to the outside of the chamber lid part 23 through the lid discharge port 237. Thus, the lid internal space 231 is filled with the nitrogen gas (step S11).

Note that in step S11, the lower opening 232 of the chamber lid part 23 does not necessarily have to be blocked airtight by the shield plate 51, and as long as the shield plate 51 overlaps with the lower opening 232, the lower opening 232 may be blocked in such a form that there is a slight gap between the shield plate 51 and the lid bottom part 234. Even in this blockage form, it is possible to fill the lid internal space 231 with the nitrogen gas by controlling the amount of nitrogen gas supplied from the gas supply part 812 to the lid internal space 231 to equate the amount of nitrogen gas flowing into the lid internal space 231 approximately with the amount of gas flowing out of this gap and the lid discharge port 237. By properly controlling the amount of nitrogen gas flowing in the space and so on, a low oxygen condition is created, in which the oxygen concentration in the lid internal space 231 is reduced to a degree that is necessary for processing. While the substrate 9 is illustrated in FIG. 1, step S11 is performed before the substrate 9 is conveyed into the substrate processing apparatus 1.

Next, in the state in which the chamber lid part 23 is spaced from the chamber body 22 as described above, the substrate 9 is conveyed into the housing 11 through a conveyance port (not shown) provided in the housing 11 and is held by the substrate holder 31 (step S12). In step S12, the substrate 9 is held by the substrate holder 31 above the upper opening 222 of the chamber body 22.

Figure 6:
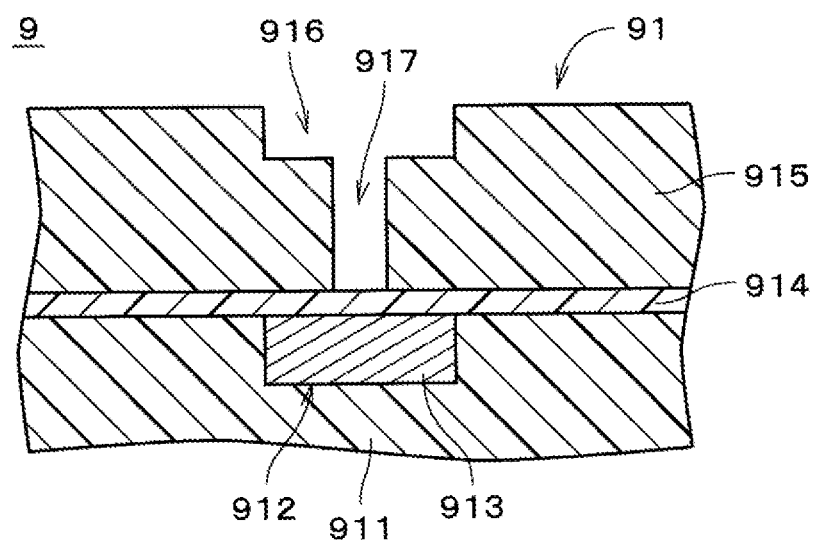
FIG. 6 is a cross-sectional view of part of a substrate.

FIG. 6 is a cross-sectional view illustrating an example of the surface of the substrate 9 that is processed by the substrate processing apparatus 1. For example, the substrate 9 may have polymer residues (i.e., residues after drying etching and ashing) adhering to the upper surface 91, and have a metal pattern exposed on the surface. The metal pattern may be a single-layer film of metal such as copper or tungsten, or a multilayer film of a plurality of laminated metal films. The multilayer film is, for example, a laminated film in which a barrier metal film for preventing diffusion is formed on the surface of a copper film.

As illustrated in FIG. 6, an interlayer insulation film 911 is formed on the upper surface 91 of the substrate 9. The interlayer insulation film 911 has a lower wiring gutter 912 dug down from the upper surface, and copper wiring 913 is buried in the lower wiring gutter 912. Then, a low-dielectric-constant insulating film 915, which is one example of a film to be processed, is laminated on the interlayer insulation film 911 via an etching stopper film 914. The low-dielectric-constant insulating film 915 has an upper wiring gutter 916 dug down from the upper surface. The low-dielectric-constant insulating film 915 also has a via hole 917 that extends from the bottom surface of the upper wiring gutter 916 to the surface of the copper wiring 913. Copper is embedded in both the upper wiring gutter 916 and the via hole 917 at the same time.

The upper wiring gutter 916 and the via hole 917 are formed by first forming a hardmask on the low-dielectric-constant insulating film 915 and then performing dry etching to remove a portion of the low-dielectric-constant insulating film 915 that is exposed from the hardmask. After the upper wiring gutter 916 and the via hole 917 are formed, ashing is performed to remove the unnecessary hardmask from the surface of the low-dielectric-constant insulating film 915. At the time of dry etching and ashing, a reaction product that contains components of the low-dielectric-constant insulating film 915 and the hard mask adheres as polymer residues to, for example, the surface of the low-dielectric-constant insulating film 915 (including the inner surfaces of the upper wiring gutter 916 and the via hole 917). Thus, processing for supplying a polymer removing liquid to the surface of the substrate 9 and removing polymer residues from the surface of the low-dielectric-constant insulating film 915 is performed after ashing.

As described above, when the substrate 9 with the copper wiring 913 as a metal pattern exposed on the surface is held by the substrate holder 31, the first movement mechanism 41 and the second movement mechanism 42 are driven so that the shield plate 51 and the chamber lid part 23 are moved downward. The chamber lid part 23 moves from the upper position illustrated in FIG. 1 to the lower position illustrated in FIG. 3. In other words, the chamber lid part 23 moves relative to the chamber body 22 in the up-down direction. Then, when the upper opening 222 of the chamber body 22 is covered with the chamber lid part 23, the chamber 21, which internally houses the substrate 9 and the substrate holder 31, is formed (step S13). In parallel with step S13, the shield plate 51 is moved upward relative to the chamber lid part 23 so that the shield plate 51 is spaced above the lower opening 232 of the chamber lid part 23 within the chamber 21 (step S14).

By moving the chamber lid part 23 from the upper position to the lower position as described above, the substrate 9 held by the substrate holder 31 moves into the lid internal space 231 through the lower opening 232 of the chamber lid part 23. In other words, in the state in which the chamber 21 is formed in steps S13 and S14, the substrate 9 is located in the lid internal space 231 of the chamber space. By moving the substrate 9 into the lid internal space 231, a nitrogen gas atmosphere (i.e., low oxygen atmosphere) can be quickly created around the substrate 9 because the lid internal space 231 is filled with the nitrogen gas as described above. In the lid internal space 231, the upper surface 91 of the substrate 9 and the lower surface 512 of the shield plate 51 oppose each other in close proximity in the up-down direction.

In the substrate processing apparatus 1, the gas supply part 812 continues the supply of nitrogen gas from step S11 onward, until the series of processing performed on the substrate 9 is completed. In the state illustrated in FIG. 3, the nitrogen gas is supplied from the first gas ports 184 (see FIG. 2) of the plurality of lid nozzles 182 located above the shield plate 51 to the lid internal space 231, and therefore, the atmospheric pressure in the lid internal space 231 becomes higher than the atmospheric pressure in the chamber-body internal space 221. In other words, a positive pressure condition is created in the lid internal space 231. Thus, the nitrogen gas in the lid internal space 231 flows out of the gap between the shield plate 51 and the lid bottom part 234 of the chamber lid part 23 into the chamber-body internal space 221 through the lower opening 232 and the upper opening 222 (i.e., sent from the lid internal space 231 to the chamber-body internal space 221). Also, the gas in the chamber-body internal space 221 is discharged through the body discharge port 226a to the outside of the chamber 21. Thus, the chamber-body internal space 221 is also filled with the nitrogen gas supplied from the gas supply part 812. In other words, the chamber 21 is filled with the nitrogen gas supplied from the gas supply part 812 (step S15). Hereinafter, the processing in step S15 is referred to as "gas replacement processing."

In step S15, the nitrogen gas from the gas supply part 812 is also supplied through the second gas port 185 (see FIG. 2) of the upper central nozzle 181 to the space between the lower surface 512 of the shield plate 51 and the upper surface 91 of the substrate 9. It is thus possible to quickly replace the atmosphere in the space between the shield plate 51 and the substrate 9 with the nitrogen gas atmosphere. Note that in any of steps S11 to S14, the nitrogen gas may be supplied as necessary from the second gas port 185. In particular, the supply of nitrogen gas from the second gas port 185 in step S14 further improves efficiency in the gas replacement processing in step S15.

Next, the first movement mechanism 41, the second movement mechanism 42, and the third movement mechanism 43 are driven to move the shield plate 51, the chamber lid part 23, and the cup part 225 of the chamber body 22 upward. The chamber lid part 23 and the cup part 225 of the chamber body 22 move from the lower positions illustrated in FIG. 3 to the upper positions illustrated in FIG. 4. In other words, the substrate 9, along with the substrate holder 31, is moved downward relative to the chamber 21 by the second movement mechanism 42 and the third movement mechanism 43. The second movement mechanism 42 and the third movement mechanism 43 serve as a substrate movement mechanism for moving the substrate 9 along with the substrate holder 31 relative to the chamber 21 in the up-down direction. The position of the shield plate 51 relative to the chamber lid part 23 remains unchanged, and the state in which the shield plate 51 is spaced above the lower opening 232 of the chamber lid part 23 is maintained.

By moving the chamber 21 from the lower position to the upper position as described above, the substrate 9 is moved from the lid internal space 231 to the chamber-body internal space 221 through the lower opening 232 and the upper opening 222 within the chamber 21 (step S16). As a result, the cup part 225 is located below the chamber lid part 23 on the radially outer side of the entire circumferences of the substrate 9 and the substrate holder 31.

When the substrate 9 has been moved to the chamber-body internal space 221, the substrate rotation mechanism 35 starts rotating the substrate 9. Then, the processing-liquid supply part 811 supplies a processing liquid to the upper surface 91 of the rotating substrate 9 through the processing-liquid ejection port 183 (see FIG. 2) of the upper central nozzle 181 (step S17). The processing liquid supplied to the central part of the rotating substrate 9 flows radially outward on the upper surface 91 by centrifugal force and is dispersed from the outer edge of the substrate 9 to the cup part 225. The processing liquid received by the cup part 225 is discharged to the outside of the chamber 21 through the body discharge port 226a in the bottom of the cup part 225.

In the substrate processing apparatus 1, predetermined processing is performed on the upper surface 91 of the substrate 9 by supplying a processing liquid for a predetermined period of time to the upper surface 91 of the substrate 9. Hereinafter, the processing in step S17 is referred to as "liquid processing." In step S17, a chemical solution (e.g., a polymer removing liquid or an etchant) is supplied for a predetermined period of time from the chemical-solution supply part 813 to the substrate 9, and then the supply of the chemical solution is stopped. As a result, chemical solution processing is performed on the substrate 9. The chemical solution on the substrate 9 is dispersed to the cup part 225 by the rotation of the substrate 9 and removed from the surface of the substrate 9. The chemical solution received by the cup part 225 is discharged through the body discharge port 226a to the outside of the chamber 21 and recovered by the chemical-solution recovery part 195 (see FIG. 2). Then, processing for rinsing the upper surface 91 of the substrate 9 is performed by supplying deionized water for a predetermined period of time from the deionized-water supply part 814 to the substrate 9. The deionized water received by the cup part 225 is discharged through the body discharge port 226a to the outside of the chamber 21 and discarded by the drainage part 196.

In the substrate processing apparatus 1, the cup part 225 may include a plurality of concentrically arranged cups. In this case, it is preferable to change the cup that receives the processing liquid from the substrate 9 when the type of processing liquid supplied to the substrate 9 is changed. This makes it easy to separately recover or discard the plurality of types of processing liquids that may be used in step S17.

As described above, the gas supply part 812 continues the supply of nitrogen gas during the supply of processing liquid to the substrate 9 in step S17. In the state illustrated in FIG. 4, similarly to the state illustrated in FIG. 3, the nitrogen gas is supplied from the first gas ports 184 of the plurality of lid nozzles 182 located above the shield plate 51 to the lid internal space 231. This preferably makes the atmospheric pressure in the lid internal space 231 higher than the atmospheric pressure in the chamber-body internal space 221, and creates a positive pressure condition in the lid internal space 231. When the lid internal space 231 is in the positive pressure condition, the nitrogen gas in the lid internal space 231 is sent from the gap between the shield plate 51 and the lid bottom part 234 of the chamber lid part 23 to the chamber-body internal space 221 through the lower opening 232 and the upper opening 222. The nitrogen gas flowing from the lid internal space 231 to the chamber-body internal space 221 is suctioned and discharged to the outside of the chamber 21 through the body discharge port 226a.

Accordingly, a generally cylindrical current of nitrogen gas is formed in the chamber 21, the current sequentially passing the vicinity of the outer circumference of the shield plate 51, the vicinity of the outer circumference of the lower opening 232, the vicinity of the outer circumference of the upper opening 222, and the vicinity of the outer circumference of the substrate 9. The supply of processing liquid to the upper surface 91 of the substrate 9 occurs inside this generally cylindrical current, and therefore it is possible to suppress mists and fumes of the processing liquid, for example, passing through the generally cylindrical current and entering into the lid internal space 231 through the gap between the shield plate 51 and the lid bottom part 234. This current also allows, for example, mists and fumes of the processing liquid to quickly flow downward and be rapidly discharged to the outside of the chamber 21.

In the substrate processing apparatus 1, this current can be readily formed by arranging the body discharge port 226a below the cup part 225. Note that the flow velocity of the current and so on can be readily adjusted by changing, for example, the amount of nitrogen gas supplied from the plurality of lid nozzles 182 and the size of the gap between the shield plate 51 and the lid bottom part 234. The body discharge port 226a does not necessarily have to be arranged below the cup part 225, and may be arranged below the substrate 9 and the substrate holder 31 that are located in the chamber-body internal space 221 as long as the current of nitrogen gas is formed.

In step S17, the nitrogen gas may also be supplied to the space between the lower surface 512 of the shield plate 51 and the upper surface 91 of the substrate 9 through the second gas port 185 of the upper central nozzle 181. If such a downward current flowing toward the upper surface 91 of the substrate 9 is formed inside the aforementioned generally cylindrical current, it is possible to push, for example, mists and fumes of the processing liquid existing in the space above the substrate 9 toward the generally cylindrical current. As a result, for example, the mists and fumes of the processing liquid can be discharged more quickly to the outside of the chamber 21 while further suppressing the entry of the mists and fumes into the lid internal space 231.

When the supply of the processing liquid to the substrate 9 has ended, the first movement mechanism 41, the second movement mechanism 42, and the third movement mechanism 43 are driven to move the shield plate 51, the chamber lid part 23, and the cup part 225 of the chamber body 22 downward. The chamber lid part 23 and the cup part 225 of the chamber body 22 move from the upper positions illustrated in FIG. 4 to the lower positions illustrated in FIG. 3. In other words, the second movement mechanism 42 and the third movement mechanism 43 move the substrate 9 along with the substrate holder 31 upward relative to the chamber 21. The position of the shield plate 51 relative to the chamber lid part 23 remains unchanged, and the state in which the shield plate 51 is spaced above the lower opening 232 of the chamber lid part 23 is maintained.

By moving the chamber 21 from the upper position to the lower position as described above, the substrate 9 is moved from the chamber-body internal space 221 to the lid internal space 231 through the upper opening 222 and the lower opening 232 within the chamber 21 (step S18). In the lid internal space 231, the upper surface 91 of the substrate 9 and the lower surface 512 of the shield plate 51 oppose each other in close proximity in the up-down direction.

Then, the substrate rotation mechanism 35 rotates the substrate 9 along with the substrate holder 31 about the central axis J1 at a relatively high speed. This rotation causes the processing liquid (e.g., deionized water) on the substrate 9 to flow radially outward on the upper surface 91 and be dispersed from the outer edge of the substrate 9 to the surroundings. As a result, the processing liquid on the substrate 9 is removed (step S19). Hereinafter, the processing in step S19 is referred to as "dry processing." The rotational speed of the substrate 9 in step S19 is higher than that in step S17.

In step S19, the processing liquid dispersed from the rotating substrate 9 is received by the inner surface of the lid body part 233 and the upper surface 235 of the lid bottom part 234 and flows to the connection between the lid body part 233 and the lid bottom part 234. Then, the processing liquid (i.e., processing liquid removed from the surface of the substrate 9 in step S19) is discharged to the outside of the chamber lid part 23 (i.e., the outside of the chamber 21) through the lid discharge port 237. As described above, the upper surface 235 of the lid bottom part 234 of the chamber lid part 23 is an inclined surface that is inclined downward outwardly in the radial direction. This prevents the processing liquid on the upper surface 235 from flowing toward the lower opening 232. This inclination also allows the processing liquid on the upper surface 235 to quickly flow radially outward and thereby to be quickly discharged from the lid internal space 231.

When the substrate 9 is rotated by the substrate rotation mechanism 35 within the lid internal space 231 (i.e., in step S19), the shield-plate rotation mechanism 55 rotates the shield plate 51 about the central axis J1 in the same rotational direction as that of the substrate 9 and at approximately the same rotational speed as that of the substrate 9, at a position that is in close proximity to the upper surface 91 of the substrate 9 in the up-down direction. By locating the shield plate 51 in close proximity to the upper surface 91 of the substrate 9, it is possible to suppress (or prevent) re-adhesion of the processing liquid dispersed from the substrate 9 to the upper surface 91 of the substrate 9. Also, the rotation of the shield plate 51 causes the processing liquid adhering to the upper surface 511 and lower surface 512 of the shield plate 51 to be dispersed to the surroundings and removed from the surface of the shield plate 51.

In the substrate processing apparatus 1, in step S19, a nitrogen gas is supplied to the space between the lower surface 512 of the shield plate 51 and the upper surface 91 of the substrate 9 through the second gas port 185 (see FIG. 2) of the upper central nozzle 181. This further speeds the discharge of the processing liquid from the space between the substrate 9 and the shield plate 51, thus accelerating the drying of the substrate 9.

When the dry processing of the substrate 9 has ended, the first movement mechanism 41 and the second movement mechanism 42 are driven to move the shield plate 51 and the chamber lid part 23 upward. The chamber lid part 23 moves from the lower position illustrated in FIG. 3 to the upper position illustrated in FIG. 1. Thus, the chamber lid part 23 and the chamber body 22 are spaced from each other in the up-down direction, and the chamber 21 is opened. Thereafter, the substrate 9 that has undergone the aforementioned series of processing is conveyed out of the housing 11 through a conveyance port (not shown) provided in the housing 11 (step S20). The shield plate 51 is moved downward relative to the chamber lid part 23 and blocks the lower opening 232 in contact with the lid bottom part 234. Then, the lid internal space 231 is filled with the nitrogen gas supplied from the gas supply part 812, as in step S11. In the substrate processing apparatus 1, the above-described steps S11 to S20 are sequentially performed on a plurality of substrates 9.

As described above, in the substrate processing apparatus 1, the shield plate 51 having a larger radial dimension than the lower opening 232 is provided in the lid internal space 231 of the chamber lid part 23. Then, in step S11 performed before the substrate 9 is conveyed and the chamber 21 is formed, the lid internal space 231 of the chamber lid part 23 is filled with the gas supplied from the gas supply part 812 in the state in which the shield plate 51 overlaps with the lower opening 232. This allows a desired gas atmosphere to be quickly created in the chamber 21 after the formation of the chamber 21. As a result, it is possible to shorten the time from the formation of the chamber 21 to the start of the processing of the substrate 9 in the gas atmosphere and to improve the productivity of the substrate processing apparatus 1.

The substrate processing apparatus 1 can quickly perform the liquid processing of the substrate 9 in a low oxygen atmosphere by, as described above, using an inert gas such as a nitrogen gas as the gas supplied from the gas supply part 812. As a result, it is possible to suppress, for example, oxidation of the metal film provided on the upper surface 91 of the substrate 9.

As described above, the chamber lid part 23 includes the lid body part 233 and the lid bottom part 234. In step S11, the lower opening 232 of the chamber lid part 23 is blocked by the lower surface 512 of the shield plate 51 and the upper surface 235 of the lid bottom part 234 that are in contact with each other. This allows the lid internal space 231 to be quickly and readily filled with gas.

In the state in which the chamber 21 is formed in step S13, the substrate 9 is located in the lid internal space 231 that is filled in advance with gas. This allows a desired gas atmosphere to be quickly created around the substrate 9 immediately after the formation of the chamber 21.

As described above, in step S15, gas replacement processing is performed in the state in which the substrate 9 is located in the lid internal space 231, and in step S16, the second movement mechanism 42 and the third movement mechanism 43 move the chamber 21 to the upper position so that the substrate 9 relatively moves from the lid internal space 231 to the chamber-body internal space 221. In step S17, liquid processing is performed on the substrate 9 in the state in which the substrate 9 is located in the chamber-body internal space 221, and in step S18, the second movement mechanism 42 and the third movement mechanism 43 move the chamber 21 to the lower position so that the substrate 9 relatively moves from the chamber-body internal space 221 to the lid internal space 231. Then, in step S19, dry processing is performed on the substrate 9 in the state in which the substrate 9 is located in the lid internal space 231.

In this way, the second movement mechanism 42 and the third movement mechanism 43 in the substrate processing apparatus 1 function as a substrate movement mechanism for moving the substrate 9 relative to the chamber 21 between the lid internal space 231 and the chamber-body internal space 221. This relative movement of the substrate 9 caused by the substrate movement mechanism occurs through the lower opening 232 and the upper opening 222 within the chamber 21 in the state in which the shield plate 51 is spaced above the lower opening 232 of the chamber lid part 23. This allows the space in which a plurality of types of processing (i.e., a series of processing including gas replacement processing, liquid processing, and dry processing) are performed on the substrate 9 to be switched between the chamber-body internal space 221 and the lid internal space 231, depending on the content of the processing.

In the liquid processing in step S17, the processing liquid dispersed from the rotating substrate 9 is received by the cup part 225 arranged below the chamber lid part 23. Thus, the processing liquid used in the liquid processing can be readily recovered. As described above, the outer cylinder part 223 that forms the chamber 21 when in contact with the chamber lid part 23 is provided around the cup part 225. By blocking the gap between the top of the outer cylinder part 223 and the cup part 225 with the outer cylinder connector 224, it is possible to reduce the space that is to be filled with the gas supplied from the gas supply part 812, within the chamber 21. As a result, the time required for the gas replacement processing in step S15 can be shortened.

In the liquid processing in step S17, the aforementioned generally cylindrical current does not necessarily have to be formed. Even if the aforementioned generally cylindrical current is not formed within the chamber 21, the entry of, for example, mists and fumes of the processing liquid into the lid internal space 231 from the gap between the shield plate 51 and the lid bottom part 234 can be suppressed by making the atmospheric pressure in the lid internal space 231 higher than the atmospheric pressure in the chamber-body internal space 221 to create a positive pressure condition in the lid internal space 231.

The substrate processing apparatus 1 described above may be modified in various ways.

For example, in the gas replacement processing in step S15, the gas does not necessarily have to be ejected from the second gas port 185 provided in the central part of the lower surface 512 of the shield plate 51. The same applies to the liquid processing in step S17 and the dry processing in step S19. In this case, the second gas port 185 may be omitted.

In the liquid processing in step S17, the lower opening 232 of the chamber lid part 23 may be blocked by the shield plate 51, due to the lower surface 512 of the shield plate 51 contacting the lid bottom part 234 of the chamber lid part 23. Even in this case, it is possible to suppress the entry of, for example, mists and fumes of the processing into the lid internal space 231.

In the dry processing in step S19, the shield plate 51 that is in close proximity to the upper surface 91 of the substrate 9 may be fixed circumferentially to the substrate holder 31 and rotated along with the substrate 9 and the substrate holder 31 by the substrate rotation mechanism 35. Even in this case, it is possible to, as described above, remove the processing liquid from the surface of the shield plate 51 while preventing re-adhesion of the processing liquid to the substrate 9 during dry processing. When the shield plate 51 is rotated by the substrate rotation mechanism 35, the shield-plate rotation mechanism 55 may be omitted.

While in the example illustrated in FIG. 1, the aforementioned chamber opening-and-closing mechanism includes the second movement mechanism 42 for moving the chamber lid part 23 and the third movement mechanism 43 for moving the cup part 225 of the chamber body 22, for example one of the second movement mechanism 42 and the third movement mechanism 43 may be omitted and only the other mechanism may be used as the chamber opening-and-closing mechanism. Also, while in the example illustrated in FIG. 1, the shield-plate movement mechanism includes the first movement mechanism 41 for moving the shield plate 51 and the second movement mechanism 42 for moving the chamber lid part 23, one of the first movement mechanism 41 and the second movement mechanism 42 may be omitted and only the other mechanism may be used as the shield-plate movement mechanism.

While in the example illustrated in FIG. 1, the aforementioned substrate movement mechanism includes the second movement mechanism 42 for moving the chamber lid part 23 and the third movement mechanism 43 for moving the cup part 225 of the chamber body 22, the substrate movement mechanism may be a mechanism for moving the substrate holder 31 in the up-down direction within the chamber 21 while the chamber 21 is stationary, for example.

In the substrate processing apparatus 1, the chamber lid part 23 does not necessarily have to move from the upper position to the lower position when forming the chamber 21 in step S13. In step S13, for example, the third movement mechanism 43 may move the cup part 225 of the chamber body 22 from the lower position illustrated in FIG. 1 to the upper position illustrated in FIG. 4 to form the chamber 21. In this case, in step S14 performed in parallel with step S13, the first movement mechanism 41 moves the shield plate 51 upward to be spaced above the lower opening 232 of the chamber lid part 23. Also, in step S15, the gas replacement processing is performed in the state in which the substrate 9 is located in the chamber-body internal space 221. Thus, the relative movement of the substrate 9 from the lid internal space 231 to the chamber-body internal space 221 (step S16) is omitted, and the liquid processing of the substrate 9 (step S17) is performed after step S15.

Figure 7:
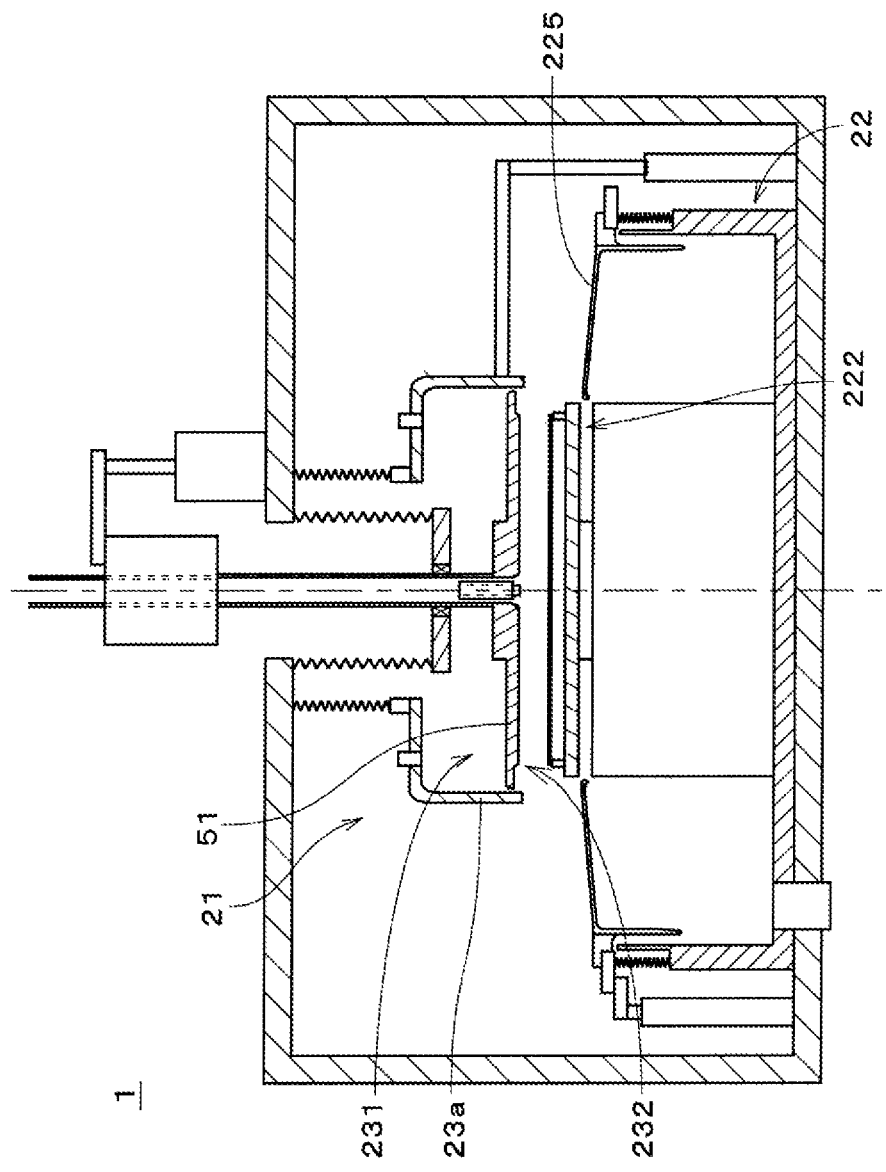
FIG. 7 is a cross-sectional view showing another example of the substrate processing apparatus.

The substrate processing apparatus 1 may include a chamber lid part 23a that has a smaller outer diameter than the chamber body 22, as illustrated in FIG. 7, instead of the chamber lid part 23 illustrated in FIG. 1. In the example illustrated in FIG. 7, the upper opening 222 of the chamber body 22 is blocked with the covered generally cylindrical chamber lid part 23a when the outer peripheral lower edge of the chamber lid part 23a comes in contact with the upper surface of the cup part 225 of the chamber body 22, and the chamber 21 is formed. The chamber lid part 23a does not include the lid bottom part 234 (see FIG. 1), and the radial dimension of the lower opening 232 is approximately the same as the radial dimension of the chamber lid part 23a. In the lid internal space 231, a shield plate 51 that has a slightly smaller radial dimension than the outer diameter of the chamber lid part 23a is arranged. When the shield plate 51 is caused to overlap with the lower opening 232 of the chamber lid part 23 in a plan view at approximately the same position in the up-down direction as the lower opening 232, the lower opening 232 is substantially blocked, although a slight gap is left around the shield plate 51 and the lower opening 232. In this state, the lid internal space 231 is filled with the gas supplied from the gas supply part 812.

Figure 8:
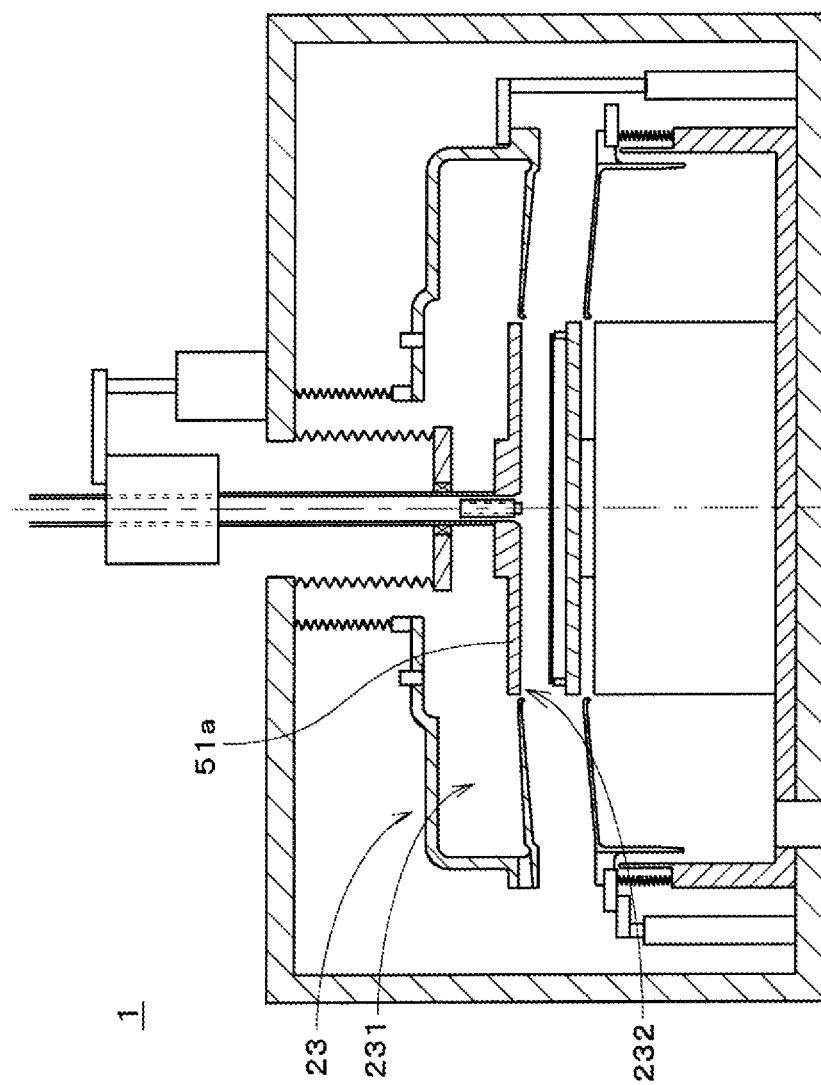
FIG. 8 is a cross-sectional view showing another example of the substrate processing apparatus.

The substrate processing apparatus 1 may include a shield plate 51a that has a slightly smaller outer diameter than the diameter of the lower opening 232, as illustrated in FIG. 8, instead of the shield plate 51 illustrated in FIG. 1. In the example illustrated in FIG. 8, the shield plate 51a having a slightly smaller radial dimension than the diameter of the lower opening 232 is arranged in the lid internal space 231. When the shield plate 51a is caused to overlap with the lower opening 232 of the chamber lid part 23 in a plan view at approximately the same position in the up-down direction as the lower opening 232, the lower opening 232 is substantially blocked, although a slight gap is left around the shield plate 51a and the lower opening 232. In this state, the lid internal space 231 is filled with the gas supplied from the gas supply part 812.

The substrate processing apparatus 1 may process various substrates other than semiconductor substrates. The substrate processing apparatus 1 is also capable of performing various types of liquid processing that are desirably performed in a low oxygen environment, not only through polymer removal or etching but also by using various processing liquids such as hydrochloric acid or hydrofluoric acid. Also, the gas that is supplied to the chamber 21 to create a low oxygen condition is not limited to a nitrogen gas, and may be other inert gases such as an argon gas. The gas supplied to the chamber 21 may be a gas for creating a desired gas atmosphere in the chamber 21, e.g., a mixed gas (i.e., a mixture of a plurality of types of gases) with a controlled gas composition ratio.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1 Substrate processing apparatus
9 Substrate
21 Chamber
22 Chamber body
23, 23a Chamber lid part
31 Substrate holder
35 Substrate rotation mechanism
41 First movement mechanism
42 Second movement mechanism
43 Third movement mechanism
51, 51a Shield plate
91 Upper surface (of substrate)
185 Second gas port
221 Body internal space
222 Upper opening (of chamber body)
223 Outer cylinder part
224 Outer cylinder connector
225 Cup part
226a Body discharge port
231 Lid internal space
232 Lower opening (of chamber lid part)
233 Lid body part
234 Lid bottom surface part
235 Upper surface (of lid bottom surface)
237 Lid discharge port
512 Lower surface (of shield plate)
811 Processing liquid supply part
812 Gas supply part
J1 Central axis
S11 to S20 Step

The invention claimed is:

1. A substrate processing method for processing a substrate in a substrate processing apparatus that comprises a substrate holder for holding a substrate in a horizontal position, a chamber lid part having a lower opening and forming a lid internal space above said lower opening, a chamber body having an upper opening and forming a chamber-body internal space, the upper opening opposing said lower opening in an up-down direction, and a shield plate that is arranged in said lid internal space to oppose an upper surface of said substrate and is capable of blocking said lower opening, the method comprising:
a) supplying gas to said lid internal space in a state in which said shield plate overlaps with said lower opening of said chamber lid part;
b) holding said substrate by said substrate holder in a state in which said chamber lid part is spaced from said chamber body;
c) moving said chamber lid part relative to said chamber body in said up-down direction, and by covering said upper opening with said chamber lid part, forming a chamber that internally houses said substrate and said substrate holder;
d) moving said shield plate upward relative to said chamber lid part to separate said shield plate from said lower opening;
e) supplying said gas into said chamber; and
f) supplying a processing liquid to said upper surface of said substrate.

2. The substrate processing method according to claim 1, wherein
in said operation b), said substrate is held by said substrate holder above said upper opening of said chamber body, and
said operation d) is performed in parallel with said operation c) so that said substrate is located in said lid internal space in a state in which said chamber is formed.

3. The substrate processing method according to claim 2, wherein
in said operation e), said gas is supplied to a space between said lower surface of said shield plate and said upper surface of said substrate through a gas port provided in a central part of a lower surface of said shield plate.

4. The substrate processing method according to claim 2, further comprising:
g) prior to said operation f), moving said substrate from said lid internal space to said chamber-body internal space through said lower opening and said upper opening by moving said substrate along with said substrate holder downward relative to said chamber.

5. The substrate processing method according to claim 4, wherein
in said operation f), atmospheric pressure in said lid internal space is higher than atmospheric pressure in said chamber-body internal space.

6. The substrate processing method according to claim 1, further comprising:
h) after said operation f), moving said substrate from said chamber-body internal space to said lid internal space through said upper opening and said lower opening by moving said substrate along with said substrate holder upward relative to said chamber; and
i) removing a processing liquid on said substrate by rotating said substrate along with said substrate holder about a central axis pointing in said up-down direction.

7. The substrate processing method according to claim 6, wherein
said chamber lid part includes:
a lid body part having an upside-down cup shape;
a ring-shaped lid bottom part that extends radially inward from a lower edge of said lid body part and has said lower opening in a central part; and
a discharge port provided at a connection between said lid bottom part and said lid body part and for discharging a processing liquid removed from the surface of said substrate in said operation i), and
an upper surface of said lid bottom part is inclined downward outwardly in said radial direction.

8. The substrate processing method according to claim 6, wherein in said operation i), said shield plate rotates about said central axis.

9. The substrate processing method according to claim 6, wherein
in said operation i), said gas is supplied to a space between said lower surface of said shield plate and said upper surface of said substrate through a gas port provided in a central part of a lower surface of said shield plate.

10. The substrate processing method according to claim 1, wherein
said substrate has a metal pattern exposed on a surface.

* * * * *